United States Patent
Lapidus et al.

(10) Patent No.: US 6,950,366 B1
(45) Date of Patent: Sep. 27, 2005

(54) METHOD AND SYSTEM FOR PROVIDING A LOW POWER MEMORY ARRAY

(75) Inventors: Peter D. Lapidus, Boulder, CO (US); Ronald Scott Hathcock, Longmont, CO (US); Yat-Loong To, Longmont, CO (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 193 days.

(21) Appl. No.: 10/426,761

(22) Filed: Apr. 30, 2003

(51) Int. Cl.[7] ................................................ G11C 7/00
(52) U.S. Cl. .................. 365/227; 365/154; 365/230.04
(58) Field of Search ............................... 365/227, 226, 365/230.03, 230.04, 238.5, 154, 189.01, 365/189.04

(56) References Cited

U.S. PATENT DOCUMENTS

| | | | |
|---|---|---|---|
| 5,384,747 A * | 1/1995 | Clohset | 365/226 |
| 5,825,709 A * | 10/1998 | Kobayashi | 365/230.03 |
| 5,844,849 A | 12/1998 | Furutani | |
| 6,046,955 A | 4/2000 | Suematsu et al. | |
| 6,188,596 B1 * | 2/2001 | Holst | 365/63 |
| 6,646,939 B2 * | 11/2003 | Kwak | 365/219 |
| 6,724,648 B2 | 4/2004 | Khellah et al. | |
| 2003/0053340 A1 | 3/2003 | Yoon et al. | |
| 2003/0058727 A1 | 3/2003 | Tanizaki et al. | |
| 2004/0057290 A1 | 3/2004 | Monzel | |

* cited by examiner

Primary Examiner—Gene N. Auduong

(57) ABSTRACT

A method for providing a low power memory array is provided. The method includes partitioning a memory array into at least two memory sections. Each memory section comprises a plurality of memory cells. A sense amplifier is provided for the memory sections. An operation request for a specified memory cell in one of the memory sections is received. The memory section comprising the specified memory cell is accessed. The requested operation is performed on the specified memory cell.

10 Claims, 7 Drawing Sheets

US 6,950,366 B1

METHOD AND SYSTEM FOR PROVIDING A LOW POWER MEMORY ARRAY

TECHNICAL FIELD OF THE INVENTION

The present invention relates generally to memory systems and, more particularly, to a method and system for providing a low power memory array.

BACKGROUND OF THE INVENTION

Different types of memory are used in different types of applications, such as electronic applications, for both temporary and permanent storage. One type of memory commonly used is static random access memory (SRAM). SRAM memory cells provide relatively high speed, and CMOS SRAM memory cells use relatively low standby power and require no refresh cycle to maintain the data stored in the SRAM cells. For these reasons, SRAM memory systems are often used in portable applications.

SRAM memory systems are typically provided in memory arrays that are arranged in rows and columns. Each SRAM memory cell may be identified by a combination of a particular row address with a particular column address. The row address has a corresponding wordline and the column address has a corresponding pair of bitlines. The wordlines and bitlines are used to read from and write to the SRAM cells.

During a typical read operation, a wordline is activated and one of the bitlines is discharged to ground. A sense amplifier then senses the difference between the bitlines for the SRAM cell to determine what value is stored in the SRAM cell. However, discharging the bitline to ground wastes power. In addition, relatively large memory arrays discharge a relatively large bitline area, which also wastes power.

SUMMARY OF THE INVENTION

In accordance with the present invention, a method and system for providing a low power memory array are provided that substantially eliminate or reduce disadvantages and problems associated with conventional methods and systems. In particular, a bitline is not fully discharged during a read operation and the memory array is partitioned in order to reduce power loss.

According to one embodiment of the present invention, a method for providing a low power memory array is provided that includes partitioning a memory array into at least two memory sections. Each memory section comprises a plurality of memory cells. A sense amplifier is provided for the memory sections. An operation request for a specified memory cell in one of the memory sections is received. The memory section comprising the specified memory cell is accessed. The requested operation is performed on the specified memory cell.

According to another embodiment of the present invention, a system for providing a low power memory array is provided that includes at least two memory sections for the memory array and a sense amplifier. Each memory section comprises a plurality of memory cells. The sense amplifier is coupled to the memory sections. The sense amplifier is operable to receive an operation request for a specified memory cell in one of the memory sections, to access the memory section comprising the specified memory cell, and to perform the requested operation on the specified memory cell.

Technical advantages of one or more embodiments of the present invention include providing an improved memory array. In a particular embodiment, the memory array is partitioned into at least two sections. As a result, the amount of bitline area discharged during a read operation is reduced by at least half. In another particular embodiment, the bitline discharged during a read operation is not fully discharged, resulting in a decreased power loss.

Other technical advantages will be readily apparent to one skilled in the art from the following figures, description, and claims.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present invention and its advantages, reference is now made to the following description taken in conjunction with the accompanying drawings, wherein like reference numerals represent like parts, in which.

DETAILED DESCRIPTION OF THE INVENTION

FIGS. 1 through 10, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged memory system.

Figure 1:
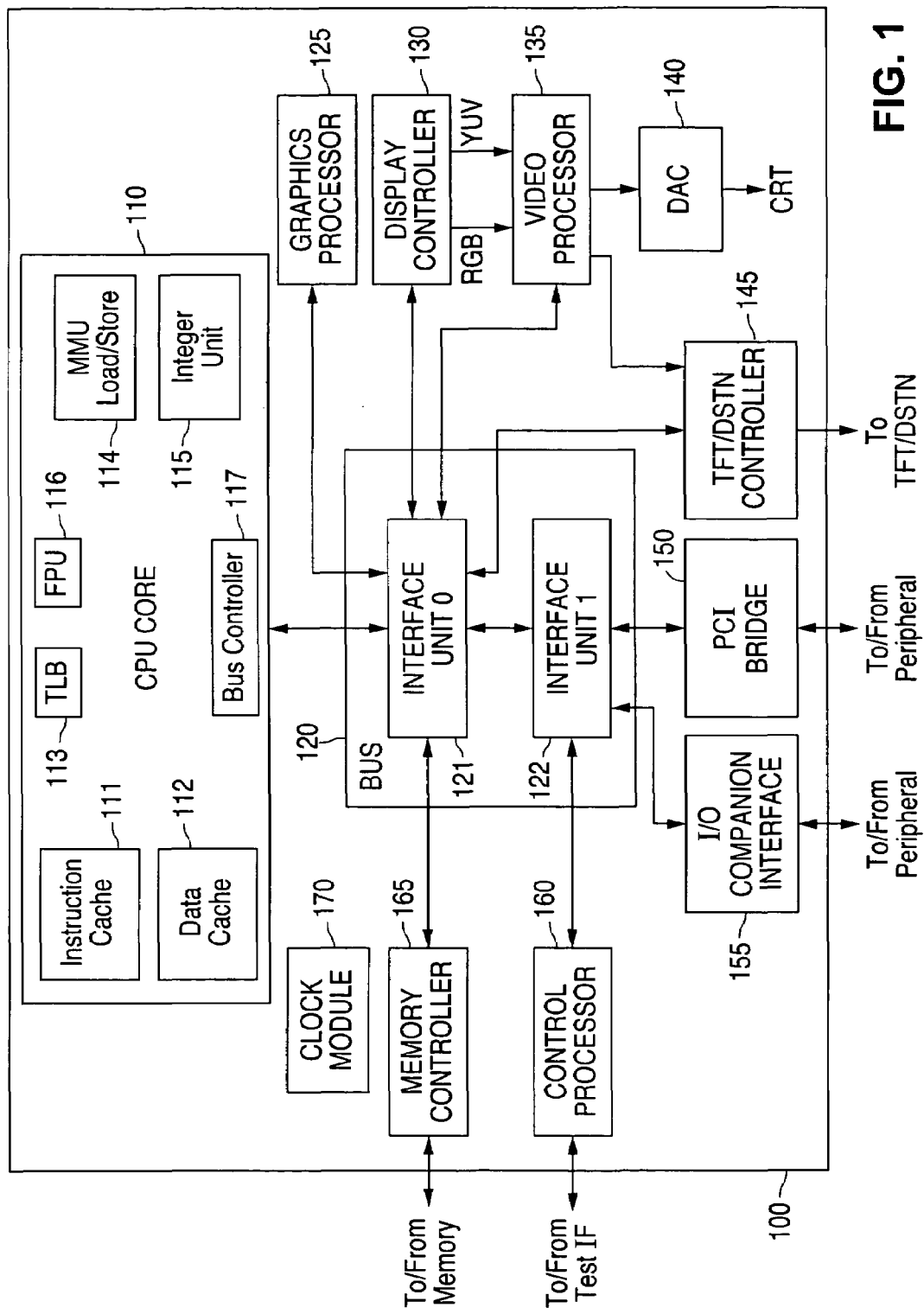
FIG. 1 is a block diagram illustrating a processing system in accordance with one embodiment of the present invention.

FIG. 1 is a block diagram illustrating a processing system 100 in accordance with one embodiment of the present invention. The processing system 100 is for illustration only. Other processing systems could be used without departing from the scope of this disclosure.

In the illustrated example, the processing system 100 includes a central processing unit (CPU) core 110. The CPU core 110 executes instructions, such as integer instructions and floating point instructions. For example, the CPU core 110 could execute instructions contained in an application executed by a host computer. In one embodiment, the processing system 100 represents an x86-compatible device. In a particular embodiment, the CPU core 110 executes instructions in a combination of instruction sets, such as the Intel Pentium, Intel Pentium Pro, AMD K6 3DNow!, AMD K7 3DNow!, AMD K7 MMX, and National Semiconductor GX1 instruction sets.

In this example, the CPU core 110 includes an instruction cache 111, a data cache 112, a translation look-aside buffer (TLB) 113, a memory management unit (MMU) load/store block 114, an integer unit 115, a floating point unit (FPU) 116, and a bus controller 117. The instruction cache 111 and the data cache 112 represent memories used to store and facilitate retrieval of information used by the CPU core 110. For example, the instruction cache 111 could store instructions that have been, are, or may be executed by the integer unit 115 or the FPU 116. The data cache 112 could store data being processed by the integer unit 115 or the FPU 116, such as operands in an arithmetic operation. The caches 111, 112 could represent any suitable memory device or combination of devices. In one embodiment, each cache 111, 112 represents sixteen kilobytes of memory space. In a particular embodiment, each cache 111, 112 represents a single-clock access, sixteen kilobyte, four-way set associative cache. While FIG. 1 illustrates two separate caches 111, 112, the caches 111, 112 could be combined into a single memory or further subdivided into additional memories. Also, the caches 111, 112 could store any other or additional information.

According to one embodiment of the present invention, as described in more detail below, the memory arrays in the caches 111, 112 are partitioned into at least two sections. As a result, the amount of bitline area discharged during a read operation in the caches 111, 112 is reduced by at least half. In addition, the bitline discharged during a read operation is not fully discharged in order to reduce power loss. Finally, the sense amplifier for each memory array comprises a shared write driver, reducing wasted die area, layout time and the loads on the signals that control the write driver stages.

The TLB 113 and MMU 114 support the use of virtual memory addresses by the processing system 100. For example, the processing system 100 may allow applications to use virtual addresses to store and retrieve instructions and data. When the application is executed, the MMU 114 may receive the virtual memory address and access the TLB 113. The TLB 113 includes a table identifying various virtual addresses and the physical addresses corresponding to those virtual addresses. Using the TLB 113, the MMU 114 converts the received virtual address into a physical memory address. The processing system 100 may then use the physical memory address to access a memory.

The integer unit 115 executes integer instructions. In one embodiment, the integer unit 115 includes a single-issue, eight-stage pipeline. In a particular embodiment, the integer pipeline includes an instruction prefetch stage, an instruction predecode stage, an instruction decode stage, an instruction queue stage, two address calculation stages, an execution stage, and a writeback stage.

In the instruction prefetch stage, raw instructions are fetched from the instruction cache 111. The instruction predecode stage extracts prefix bytes from the raw instruction bits. The predecode operation also looks-ahead to the next instruction and a potential bubble can be eliminated if the pipeline stalls downstream. The instruction decode stage performs a full decode of the instruction data and indicates the instruction length back to the prefetch stage, allowing the prefetch stage to shift the appropriate number of bytes to the beginning of the next instruction.

The instruction queue stage comprises a first in-first out (FIFO) queue containing decoded x86 instructions. The instruction queue allows the instruction decode stage to proceed even if the pipeline is stalled downstream. Register read operations for data operand address calculations are performed in the instruction queue stage. The first address calculation stage computes the linear address of operand data (if required) and issues requests to data cache 112. Microcode can take over the pipeline and inject a micro-box if multi-box instructions require additional data operands. In the second address calculation stage, operand data (if required) is returned and set up to the execution unit stage with no bubbles if there was a data cache hit. Segment limit checking also is performed on the data operand address. The micro-read-only-memory ($\mu$ROM) is read for setup to the execution unit stage.

In the execution unit stage, register and/or data memory fetches are fed through an arithmetic logic unit (ALU) for arithmetic or logical operations. The $\mu$ROM may fire for the first instruction box into the pipeline. Microcode may control the pipeline and insert additional boxes in the execution unit stage if the instruction requires multiple execution unit stages to complete. The writeback stage writes results of the execution unit stage to the register file or to data memory.

The FPU 116 executes floating point instructions. In one embodiment, the FPU 116 includes multiple pipelines, such as an execution pipeline and a load/store pipeline. Also, the FPU 116 can execute instructions in one or more instruction sets, such as the x87, MMX, and 3DNow! instruction sets. The FPU 116 could also support dynamic scheduling of instructions, which may help to reduce stalls in the pipelines of the FPU 116. The FPU 116 could further support out-of-order execution and register renaming. In addition, the FPU 116 could perform floating point operations in accordance with the IEEE 754 standard and support an instruction issue rate of one instruction per clock from the integer core. In a particular embodiment, the FPU 116 could have a data path that is optimized for single precision arithmetic, while extended precision arithmetic is handled by microcode and multiple passes through the pipelines of the FPU 116.

The bus controller 117 facilitates communication between the CPU core 110 and other components of the processing system 100. For example, when needed data is not available in the caches 111, 112, the bus controller 117 could support the transfer of the data from the external memory to the CPU core 110 over an internal bus 120.

The internal bus 120 facilitates communication between various components of the processing system 100. In this example, the bus 120 includes a first interface unit 121 and a second interface unit 122. The first interface unit 121 facilitates communication between higher-speed components of the processing system 100, while the second interface unit 122 facilitates communication between lower-speed components of the processing system 100. The interface units 121, 122 may also communicate with each other so that the higher-speed components and the lower-speed components may communicate. While FIG. 1 may illustrate a certain component of the processing system 100 as representing a "higher-speed" or "lower-speed" component, this is for illustration only. Each component could operate at any suitable speed.

A graphics processor 125 processes graphics data for display to a user. The graphics processor 125 could, for example, include a bit block transfer (bitBLT) engine, a raster operations (ROP) unit, and an alpha compositing unit. The bitBLT engine transforms blocks of pixels, such as by changing colors or shades of pixels or rotating a block of pixels. The ROP unit performs various raster operations on the graphics data, such as 256 standard raster operations. The alpha compositing unit supports transparency of the graphics data. The graphics processor 125 could further support pattern generation, source expansion, pattern/source transparency, and ternary raster operations.

A display controller 130 generates displays for presentation to a user, including displays using the graphics produced by the graphics processor 125. The display controller 130 may retrieve graphics, video, and overlay streams from a frame buffer, serialize the streams, and perform any color look-ups and output formatting. The display controller 130 may also interface with a display filter for driving a display device. The display controller 130 may include a graphical user interface (GUI) and a video graphics array (VGA), which provides full hardware compatibility with the VGA graphics standard. For example, the VGA may pass eight-bit pixels and sync signals to the GUI, which may expand the pixels to 24-bit color values using a color lookup table.

A video processor 135 receives graphics data, video data, or other information to be displayed. The video processor 135 then outputs digital data capable of being displayed to a user. For example, the video processor 135 could mix graphics and video streams and output digital red, green, and blue (RGB) data. The video processor 135 could be capable of delivering high resolution and true color graphics. The video processor 135 may also overlay or blend a scaled true color video image on the graphics background.

The output of the video processor 135 may be supplied to a digital-to-analog converter (DAC) 140 or a Thin Film Transistor/Double-Layer Supertwist Nematic (TFT/DLSN) controller 145. The DAC 140 converts the digital values from the video processor 135 into analog values for display on a cathode ray tube (CRT). The DAC 140 may, for example, represent a 3×8 bit DAC. The TFT/DLSN controller 145 uses the digital values from the video processor 135 to generate a digital output signal suitable for display on a flat-panel liquid crystal display (LCD). In a particular embodiment, the TFT/DSTN controller 145 may drive all standard flat panel monitors up to 1024×768 resolution.

A PCI bridge 150 facilitates communication with an external PCI bus. For example, the PCI bridge 150 could support communication with a sound card, disk drive, or other device over the PCI bus. In one embodiment, the PCI bridge 150 includes read and write FIFO queues, an interface controller, and a PCI arbiter.

An input/output (I/O) companion interface 155 allows the processing system 100 to receive several signals that support functions such as resets, interrupts, and system power management.

A control processor 160 manages reset control, the macro clock, and debugging functions in the processing system 100. In one embodiment, the control processor 160 includes a JTAG interface and scan chain control logic. The control processor 160 also supports chip reset, which includes initial phase-locked loop (PLL) control and programming, and runtime power management macro-clock control. The JTAG support may include a TAP controller that is IEEE 1149.1 compliant. Control of the processing system 100 can be obtained through the JTAG interface into the TAP controller. Internal registers, including registers in the CPU core 110, may be accessed. In-circuit emulation (ICE) capabilities may be supported through the JTAG and TAP controller interface.

A memory controller 165 facilitates access to one or more external memories, such as one or more RAM modules or a mass storage device like a hard drive. For example, various components of the processing system 100, such as the CPU core 110, graphics processor 125, display controller 130, and TFT/DSTN controller 145, may need to store or retrieve data from the external memory, and the memory controller 165 facilitates access to the external memory. In one embodiment, the memory controller 165 can facilitate access to both single data rate (SDR) and dual data rate (DDR) memory. Also, the memory controller 165 can facilitate access to any amount of external memory, such as one gigabyte of memory. In a particular embodiment, the memory controller 165 allows data used by the CPU core 110 and graphics data to be stored in the external memory, thereby supporting a unified memory architecture (UMA).

A clock module 170 generates clock signals used by the various components of the CPU 100. For example, the clock module 170 could generate signals used by the CPU core 110 to execute integer and floating point instructions.

Figure 2:
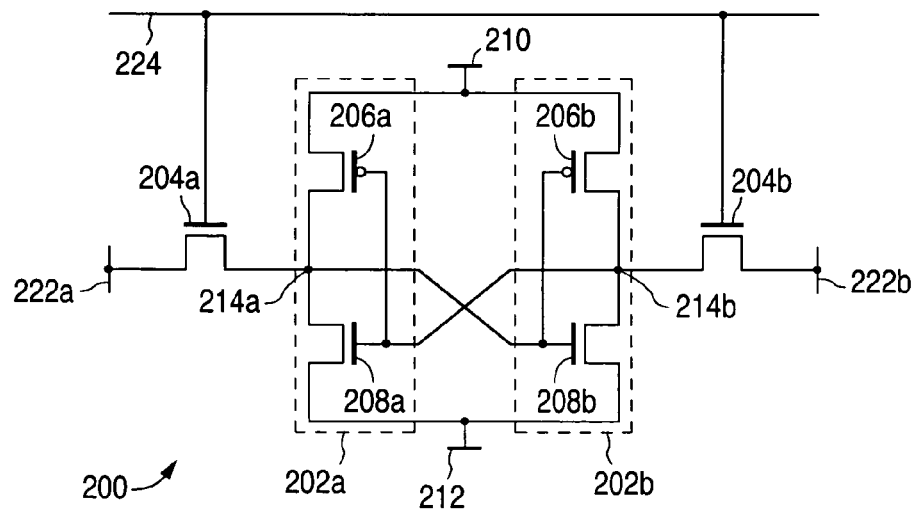
FIG. 2 is a block diagram illustrating a static random access memory (SRAM) cell for use in the processing system of FIG. 1 in accordance with one embodiment of the present invention.

FIG. 2 is a block diagram illustrating a static random access memory (SRAM) cell 200 for use in the processing system 100 in accordance with one embodiment of the present invention. The SRAM cell 200 comprises a cross-coupled pair of inverters 202a and 202b and a pair of access transistors 204a and 204b.

Each inverter 202 comprises a p-channel, pull-up transistor 206 and an n-channel, pull-down transistor 208. The drains of the transistors 206 and 208 are coupled to each other, and the gates of the transistors 206 and 208 are also coupled to each other. The source of the transistor 206 is coupled to a high potential node 210, and the source of the transistor 208 is coupled to a ground potential node 212.

The drains of the transistors 206a and 208a are coupled to the access transistor 204a at an output node 214a, and the gates of the transistors 206a and 208a are coupled to the access transistor 204b at an output node 214b. Similarly, the drains of the transistors 206b and 208b are coupled to the access transistor 204b at the output node 214b, and the gates of the transistors 206b and 208b are coupled to the access transistor 204a at the output node 214a. The access transistor 204a is coupled to a bitline 222a, the access transistor 204b is coupled to an inverted bitline 222b, and the gates of the access transistors 204 are coupled to a wordline 224 for the SRAM cell 200.

The SRAM cell 200 may be part of a memory array made up of a plurality of rows and columns of SRAM cells. According to one embodiment described in more detail below in connection with FIGS. 3–5, the memory array may be partitioned into a plurality of sections. Each SRAM cell may be accessed for a read or a write operation with a row select signal and a column select signal that together identify a particular SRAM cell.

In operation, when the SRAM cell 200 is not being accessed for a read or write, one of the output nodes 214 is at a high voltage corresponding to the voltage at the high potential node 210 and the other output node 214 is at a low voltage corresponding to the voltage at the ground potential node 212. The value stored in the SRAM cell 200 is based on which output node 214 is high and which output node 214 is low.

As described in more detail below in connection with FIGS. 6 and 7, during a read operation, the wordline 224 is activated and one of the bitlines 222a or 222b is discharged until it reaches a predetermined read potential that is higher than the ground potential 212 but is sufficiently low to allow an accurate read. Once the bitline 222a or 222b reaches the read potential, the wordline 224 is deactivated, causing the bitline 222a or 222b to stop discharging. The difference between the voltages of the bitlines 222a and 222b may then be detected to determine the value of the bit stored in the SRAM cell 200.

As described in more detail below in connection with FIGS. 8–10, during a write operation, one of the bitlines 222a or 222b is discharged to the ground potential 212 and the wordline 224 is activated by a shared write driver that is part of a sense amplifier. When the state of the SRAM cell 200 is different from the state being written into the SRAM cell 200 by the shared write driver, the wordline 224 flips the state of the SRAM cell 200.

Figure 3:
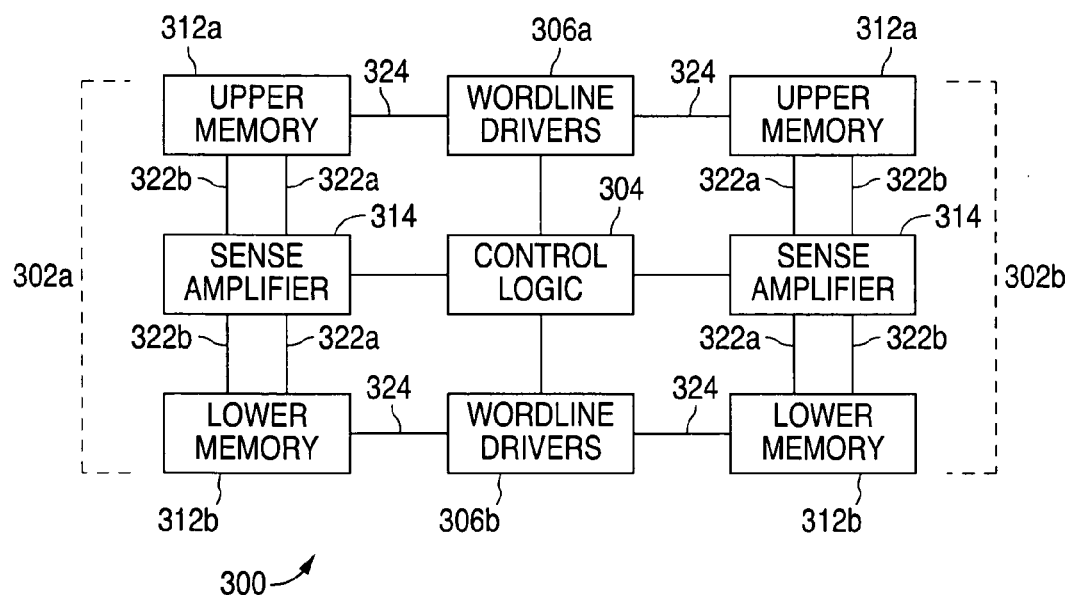
FIG. 3 is a block diagram illustrating a system for providing a low power memory array comprising the SRAM cell of FIG. 2 in accordance with one embodiment of the present invention.
Figure 4:
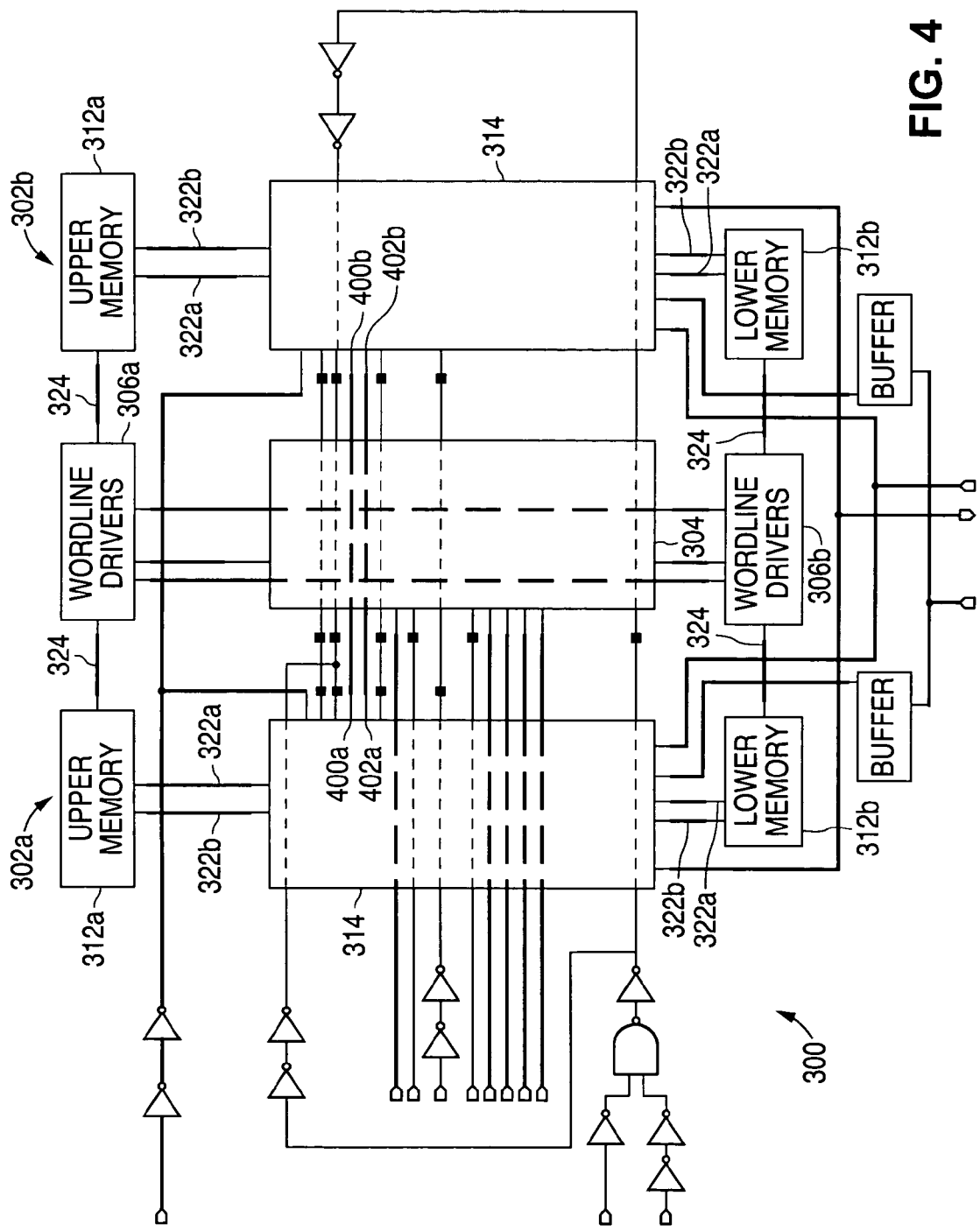
FIG. 4 is a block diagram illustrating details of the system of FIG. 3 in accordance with a specific embodiment of the present invention.

FIG. 3 is a block diagram illustrating a system 300 for providing a low power memory array 302 comprising the SRAM cell 200 in accordance with one embodiment of the present invention, and FIG. 4 is a block diagram illustrating details of the system 300 in accordance with a specific embodiment of the present invention.

The system 300 may comprise a plurality of low power memory arrays 302, control logic 304 and wordline drivers 306. Although the illustrated embodiment comprises two memory arrays 302 and two wordline drivers 306, it will be understood that the system 300 may comprise any suitable number of memory arrays 302 and wordline drivers 306 without departing from the scope of the present invention.

Each memory array 302 comprises at least two memory sections 312. However, it will be understood that any or all of the memory arrays 302 may comprise more than two memory sections 312 without departing from the scope of the present invention. For the illustrated embodiment, each memory array 302 comprises an upper memory section 312a and a lower memory section 312b. It will be understood that the terms "upper" and "lower" with regard to these memory sections 312a and 312b are for discussion purposes only and are not meant to indicate that the upper memory section 312a is physically above the lower memory section 312b. Each memory array 302 also comprises a sense amplifier 314 that is operable to provide amplification for the memory sections 312 in that memory array 302.

The control logic 304 is coupled to the wordline drivers 306 and to the sense amplifiers 314 in the memory arrays 302. Each wordline driver 306 is coupled to a memory section 312 in each memory array 302. In addition, the sense amplifier 314 in each memory array 302 is coupled to the memory sections 312 in that memory array 302.

In operation, depending on whether the memory array 302 is being read or written to, the control logic 304 may cause the sense amplifiers 314 to discharge bitlines 222a or 222b in a bitline bus 322a or 322b and/or to sense the difference between a bitline 222a in a bitline bus 322a and a bitline 222b in a bitline bus 322b. For read operations, a bitline 222 is discharged by a cell in the selected memory section 312 to a read potential that is higher than the ground potential 212. For write operations, a bitline 222 is discharged to the ground potential 212. The control logic 304 may also cause the wordline drivers 306 to either activate or deactivate wordlines 224 in a wordline bus 324 for reading from and writing to the SRAM cells 200 in the memory arrays 302, as described in more detail above in connection with FIG. 2.

In accordance with one embodiment of the present invention, when the control logic 304 is reading from or writing to a particular SRAM cell 200, the memory section 312 comprising that SRAM cell 200 is accessed with no need to access other memory sections 312. For example, if the SRAM cell 200 is part of the lower memory 312b in the memory array 302a, the sense amplifier 314 in the memory array 302a and the wordline driver 306b only have to access the lower memory section 312b in the memory array 302a, thereby reducing the power up to 50% or more based on the number of memory sections 312 in each memory array 302.

For the embodiment illustrated in FIG. 4, the control logic 304 is operable to provide a "select upper" signal at upper nodes 400 and a "select lower" signal at lower nodes 402 for the sense amplifiers 314. The select upper signal indicates that the upper memory 312a is to be accessed, while the select lower signal indicates that the lower memory 312b is to be accessed by the corresponding sense amplifier 314.

Figure 5:
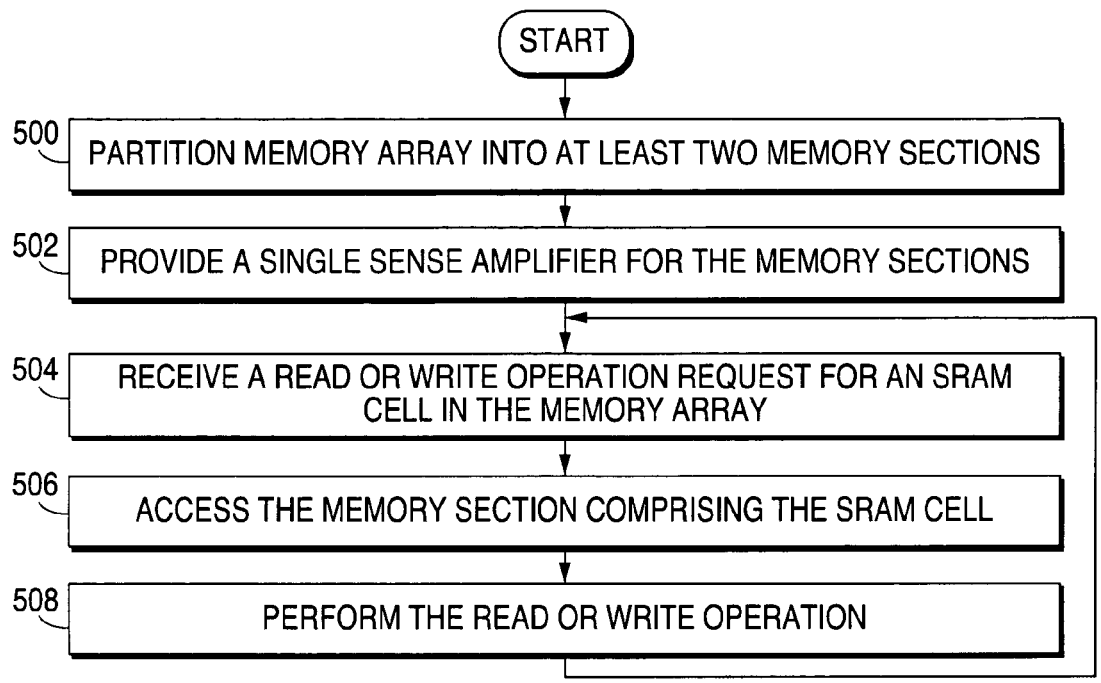
FIG. 5 is a flow diagram illustrating a method for providing the low power memory array of FIG. 3 in accordance with one embodiment of the present invention.

FIG. 5 is a flow diagram illustrating a method for providing the low power memory array 302 in accordance with one embodiment of the present invention. The method begins at step 500 where a memory array 302 is partitioned into at least two memory sections 312. At step 502, a single sense amplifier 314 is provided for the memory sections 312 of the memory array 302.

At step 504, the sense amplifier 314 receives a read or write operation request for an SRAM cell 200 in the memory array 302. At step 506, the sense amplifier 314 accesses the memory section 312 comprising that SRAM cell 200. At step 508, the read or write operation is performed, and the method returns to step 504 where the sense amplifier 314 may receive another read or write operation request for another SRAM cell 200.

Figure 6:
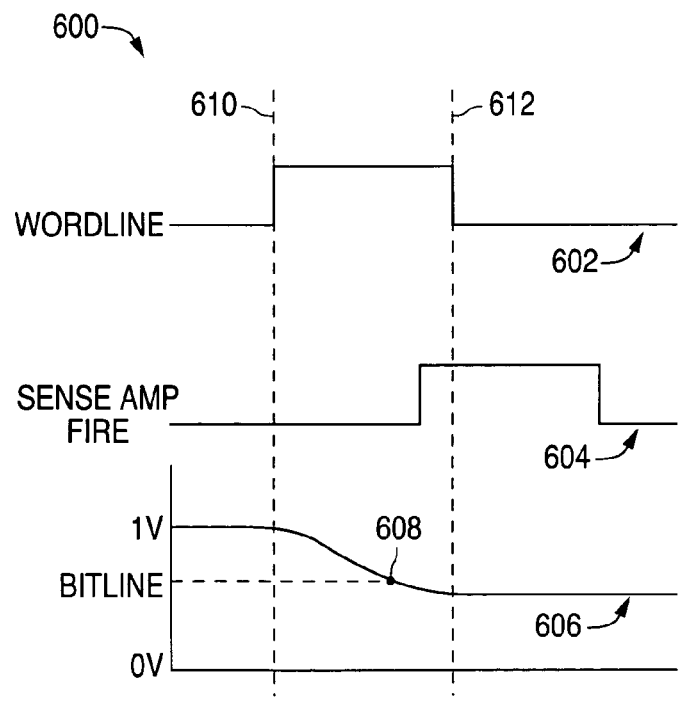
FIG. 6 is a timing diagram illustrating selected signals in the system of FIG. 3.

FIG. 6 is a timing diagram 600 illustrating selected signals 602, 604, 606 in the system 300 during a read operation. The wordline 602 is activated at the time indicated by the line 610. The wordline 602 being activated causes the bitline 606 to begin discharging.

The bitline 606 discharges until reaching a specified read potential (x volts) 608. The read potential 608 comprises the voltage between the low and high voltages for the bitline 606 at which a reliable read may be performed. Although the illustrated embodiment shows the bitline 606 with a range of 0 to 1 volts, it will be understood that the bitline 606 may range from any suitable low to high voltage without departing from the scope of the present invention. For the illustrated embodiment, the read potential 608 may comprise approximately 0.8 volts.

Once the bitline 606 reaches the read potential 608, the sense amplifier 604 fires, a read is performed, and the wordline 602 is deactivated at the time indicated by the line 612. The wordline 602 being deactivated causes the bitline 606 to stop discharging.

Figure 7:
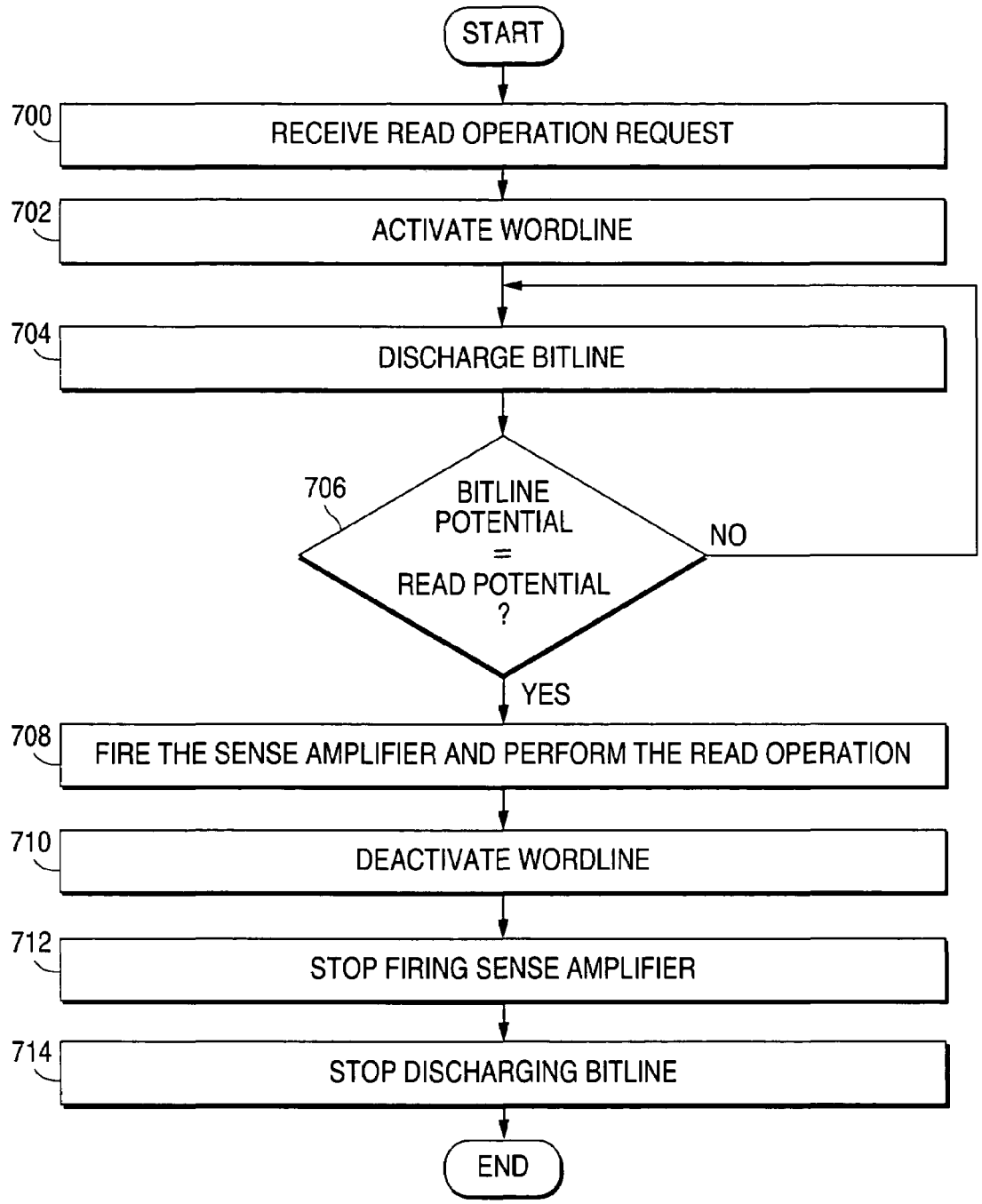
FIG. 7 is a flow diagram illustrating a method for providing a low power memory array in accordance with one embodiment of the present invention.

FIG. 7 is a flow diagram illustrating a method for providing a low power memory array in accordance with one embodiment of the present invention. The method begins at step 700 where a read operation request is received. At step 702, the wordline 602 is activated. At step 704, the bitline 606 begins to be discharged.

At decisional step 706, a decision is made regarding whether or not the potential of the bitline 606 has reached the read potential 608. If the bitline 606 has not reached the read potential 608, the method follows the No branch from decisional step 706 and returns to step 704 where the bitline 606 continues discharging. Once the bitline 606 reaches the read potential 608, the method follows the Yes branch from decisional step 706 to step 708.

At step 708, the sense amplifier 604 is fired and the read operation is performed. At step 710, the wordline 602 is deactivated. At step 712, the sense amplifier 604 stops firing. At step 714, the bitline 606 stops discharging, at which point the method comes to an end.

Figure 8:
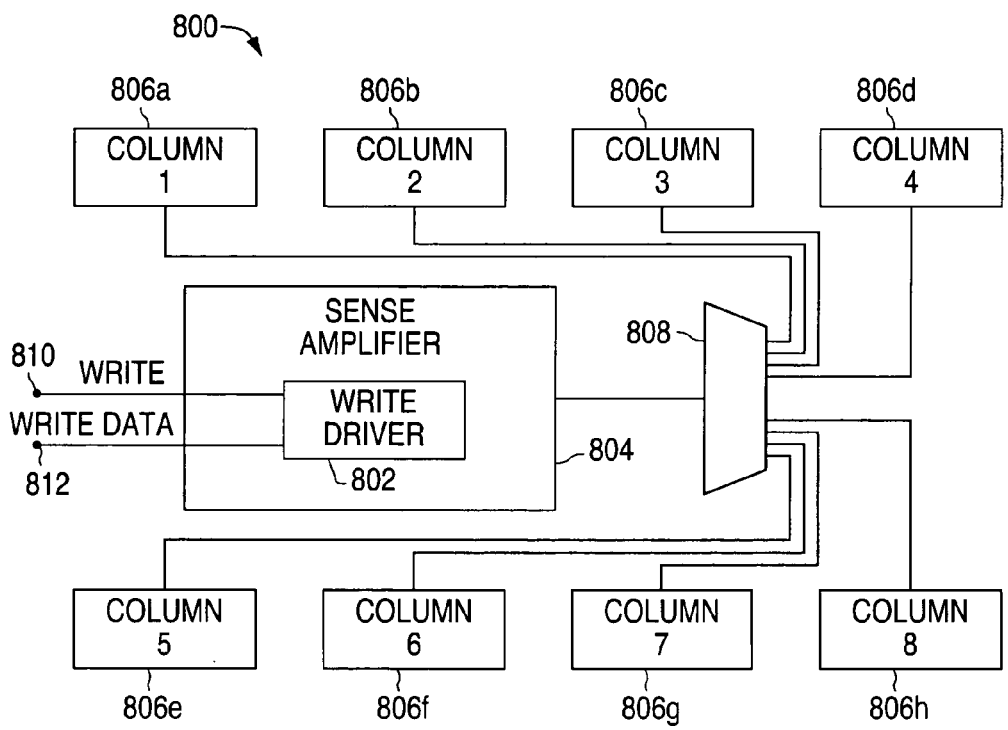
FIG. 8 is a block diagram illustrating a system for providing a shared write driver in accordance with one embodiment of the present invention.
Figure 9:
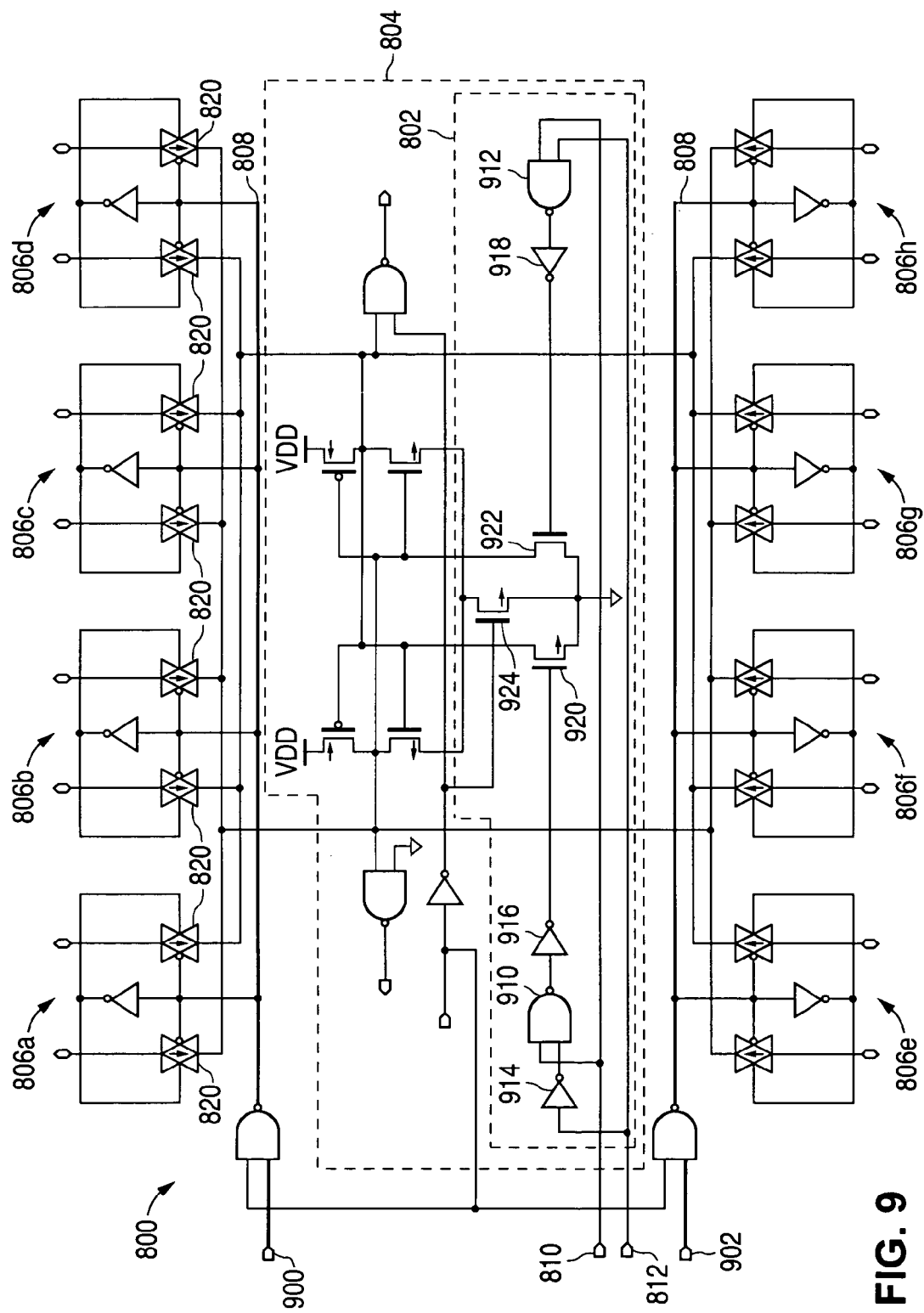
FIG. 9 is a block diagram illustrating details of the system of FIG. 8 in accordance with a specific embodiment of the present invention.

FIG. 8 is a block diagram illustrating a system 800 for providing a shared write driver 802 in accordance with one embodiment of the present invention, and FIG. 9 is a block diagram illustrating details of the system 800 in accordance with a specific embodiment of the present invention.

The system 800 comprises a sense amplifier 804, a plurality of memory columns 806 and a multiplexer 808. The sense amplifier 804 is operable to access any of the columns 806 through the multiplexer 808. According to one embodiment, the columns 806a–d may correspond to the upper memory section 312a and the columns 806e–h may correspond to the lower memory section 312b, as described above in connection with FIGS. 3–5.

The sense amplifier 804 comprises the shared write driver 802. Thus, the write driver 802 is also operable to access any of the columns 806 through the multiplexer 808. In this way, a single write driver 802 may be shared by multiple memory columns 806 and/or memory sections 312.

The write driver 802 is operable to receive a write signal at a write node 810 and write data at a write data node 812. The write signal and write data cause the write driver 802 to access a particular SRAM cell 200 in a memory column 806 and to write a 1 or 0 to that SRAM cell 200.

As illustrated in FIG. 9, each memory column 806 comprises a pair of transmission gates 820 that allows the shared write driver 802 to write either a 1 or 0 to the SRAM cells 200 in that memory column 806. Also as illustrated in FIG. 9, the system 800 is operable to receive a "select upper" signal at an upper node 900 and a "select lower" signal at a lower node 902. The select upper signal indicates that the upper memory columns 806a–d are to be accessed, while the select lower signal indicates that the lower memory columns 806e–h are to be accessed.

According to the embodiment illustrated in FIG. 9, the write driver comprises a first NAND gate 910, a second NAND gate 912, a first inverter 914, a second inverter 916, third inverter 918, a first transistor 920, a second transistor 922, and a third transistor 924. The first inverter 914 is coupled to a first input for the first NAND gate 910. The second inverter 916 is coupled to an output for the first NAND gate 910 and to the first transistor 920. The third inverter 918 is coupled to an output for the second NAND gate 912 and to the second transistor 922. The first and second transistors 920, 922 are coupled to the third transistor 924.

A second input for the first NAND gate 910 and a first input for the second NAND gate 912 are operable to receive the write signal from the write node 810. The first inverter 914 and a second input for the second NAND gate 912 are operable to receive a write data signal from the write data node 812. The third transistor 924 couples the write driver 802 to the sense amplifier 804.

Figure 10:
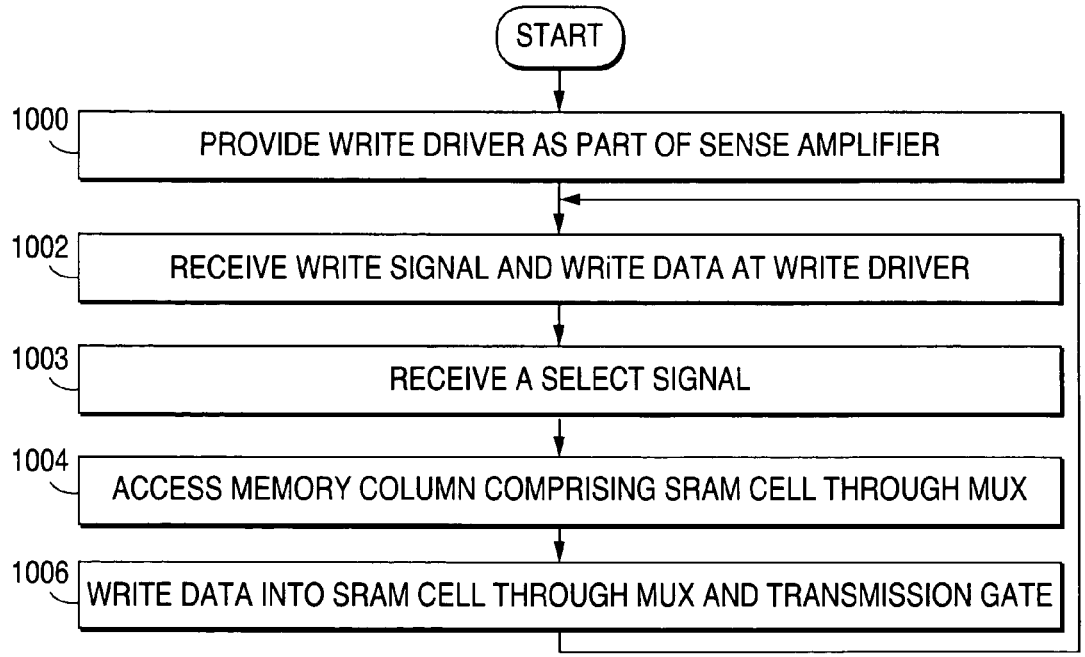
FIG. 10 is a flow diagram illustrating a method for providing the shared write driver of FIG. 8 in accordance with one embodiment of the present invention.

FIG. 10 is a flow diagram illustrating a method for providing the shared write driver 802 in accordance with one embodiment of the present invention. The method begins at step 1000 where the write driver 802 is provided as part of the sense amplifier 804. At step 1002, the write driver 802 receives a write signal at the write node 810 and write data at the write data node 812 for writing into an SRAM cell 200. At step 1003, the multiplexer 808 receives a select upper signal or a select lower signal.

At step 1004, the write driver 802 accesses the memory column 806 comprising the SRAM cell 200 through the multiplexer 808. At step 1006, the write driver 802 writes the data into the SRAM cell 200 through the multiplexer 808 and a transmission gate 820, and the method returns to step 1002 where the sense amplifier 804 may receive another write operation request for another SRAM cell 200.

Although the present invention has been described with several embodiments, various changes and modifications may be suggested to one skilled in the art. It is intended that the present invention encompass such changes and modifications as fall within the scope of the appended claims.

What is claimed is:

1. A system comprising:
    at least two memory sections for a memory array, each memory section comprising a plurality of memory cells;
    a sense amplifier coupled to the memory sections, the sense amplifier operable to receive an operation request for a specified memory cell in one of the memory sections, to access the memory section comprising the specified memory cell, and to perform the requested operation on the specified memory cell; and
    a wordline and a bitline coupled to the specified memory cell, the wordline operable to be activated after the read operation request is received, the bitline operable to be discharged to a read potential, wherein the read potential is at a level greater than a ground potential, the sense amplifier operable to read a value stored in the specified memory cell in response to the bitline reaching the read potential.

2. The system of claim 1, wherein the operation request comprises a read operation request, and wherein the wordline is further operable to be deactivated in response to the bitline reaching the read potential.

3. The system of claim 1, the bitline further operable to be stopped from discharging in response to the bitline reaching the read potential.

4. A method for providing a low power memory array, comprising:
    receiving a read operation request for a specified memory cell of the memory array;

activating a wordline for the specified memory cell;

discharging a bitline for the specified memory cell to a read potential, wherein the read potential is at a potential greater than ground; and stopping the bitline from discharging to ground in response to the bitline reaching the read potential.

5. The method of claim 4, further comprising:

deactivating the wordline in response to the bitline reaching the read potential.

6. The method of claim 5, wherein reading the value stored in the specified memory cell comprises firing a sense amplifier.

7. The method of claim 4 further comprising:

reading a value stored in the specified memory cell in response to discharging the bitline to the read potential.

8. A method for providing a low power memory array for read operations, the memory array comprising a plurality of memory cells, the method comprising:

activating a wordline for a specified memory cell;

discharging a bitline for the specified memory cell to a read potential, wherein the read potential is greater than a ground potential;

reading a value stored in the specified memory cell in response to the bitline reaching the read potential; and deactivating the wordline in response to the bitline reaching the read potential.

9. The method of claim 8, further comprising reading a value stored in the specified memory cell comprising firing a sense amplifier.

10. The method of claim 9, further comprising stopping the bitline from discharging in response to the bitline reaching the read potential.

* * * * *